INVENTORS
GESINUS DIEMER
FELIX VAN DER MAESEN
BY
Frank R. Trifari
AGENT

INVENTORS
GESINUS DIEMER
FELIX VAN DER MAESEN
BY
Frank R. Trifari
AGENT

United States Patent Office 3,436,619

Patented Apr. 1, 1969

3,436,619

INSULATED GATE FIELD-EFFECT TRANSISTOR WITH WIDENING CURRENT PATH BETWEEN SOURCE AND DRAIN

Gesinus Diemer, Emmasingel, Eindhoven, and Felix van der Maesen, Geldrop, Netherlands, assignors to North American Philips Company, Inc., New York, N.Y., a corporation of Delaware Filed Feb. 3, 1966, Ser. No. 524,705

Claims priority, application Netherlands, Feb. 17, 1965, 6501947

Int. Cl. H01l *11/14*

U.S. Cl. 317—235 7 Claims

ABSTRACT OF THE DISCLOSURE

A semiconductor device of the insulated gate, field-effect transistor type in thin-film form employing a semiconductor layer defining a current-carrying portion between source and drain electrodes. Means are provided for causing the current-carrying portion to widen in a direction from the source to the drain, the widening occurring in a direction transverse to the current-carrying direction. Among the advantages obtained is a more uniform electric field in the current-carrying region which reduces local high field strengths and hot spots. In a preferred arrangement, the control or gate electrode contains notches which narrow in the direction from the source to the drain.

Figure 1:
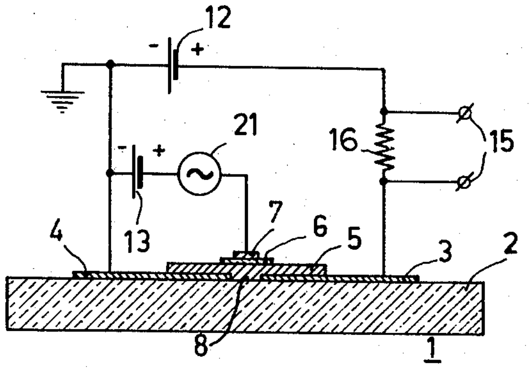

The invention relates to a semiconductor device comprising a semiconductor layer which is arranged on an electrically insulating support and which is provided with a source and a drain electrode, a strip-shaped part of the semiconductor layer being provided betwen the said electrodes, an insulating layer supporting a strip-shaped control electrode being arranged on the said strip-shaped part. Means are provided for setting up a bias voltage at the drain electrode with respect to the source electrode inducing a current flowing between the source and drain electrode substantially transversely through the strip-shaped part mainly because charge carriers move in the direction from the source electrode to the drain electrode, and further means are provided for setting up a bias voltage at the control electrode with respect to the source electrode to influence the said current. The invention further relates to a semiconductor circuit element for use in such a device.

The semiconductor layer on the insulating support which is provided with electrodes is usually termed a TFT-transistor (thin film transistor), since said transistor is built up, at least for the greater part, from thin films.

In the said devices in the depletion mode a bias voltage can be set up at the control electrode in which the concentration of charge carriers in a surface layer of the semiconductor layer adjacent the insulating layer is decreased and in which the current mainly flows through the part located below the surface layer of the semiconductor layer, in the depletion mode the current path. In this case the resistance of the semiconductor layer between the source and drain electrode is increased.

In addition in the enhancement mode, a bias voltage can be set up at the control electrode, in which the concentration of charge carriers in a surface layer of the semiconductor layer adjoining the insulating layer is increased, the current mainly flowing through the said surface layer which in this case constitutes the current path. In the enhancement mode the resistance between the source and drain electrode is decreased.

In both cases the thickness of and the conduction in the current path, going from the source electrode to the drain electrode, is not constant since the control electrode, the insulating layer and the semiconductor layer form a capacitor, while in the semiconductor layer a drop of potential occurs as a result of the voltage difference between the source and drain electrode causing a current flowing through the semiconducting layer. As a result of this the field strength also in the current path, going from the source electrode to the drain electrode, is not constant and depends on the place where it is measured.

The invention is based inter alia on the recognition of the fact that a field strength in the current path which depends on the place where it is measured is undesired and that this dependency can be avoided, at least decreased.

It is an object of the invention to provide a semiconductor device in which the said drawback does not occur or occurs at least to a decreased extent, and a semiconductor device of the type described in the preamble is characterized according to the invention in that the path which the current can follow substantially transversely through the strip-shaped part of the semiconductor layer has an increasing width in the direction from the source electrode to the drain electrode, said width being measured in the longitudinal direction of the strip-shaped part.

As a result of this a substantially constant field strength can be obtained along the current path between the source and drain electrode since the variation in width of the current path can compensate for the variation in conduction of the current path.

It is noted that the strip-shaped control electrode may comprise a widening extension for contact purposes.

It has been found that particularly favourable results are obtained when the width of the path which the current can follow has at least an increase by a factor 2, while the said width preferably has an increase by a factor at least equal to 5 and at most equal to 20.

An advantage occurring at a field strength in the current path which, going from the source electrode to the drain electrode, is substantially constant is that the transit time of the charge carriers which move in the direction from the source electrode to the drain electrode then is at a minimum as a result of which a maximum frequency range becomes possible.

In addition, when the field strength is constant, a large modulation is possible of the current through the semiconductor layer in the case of modulation of the bias voltage at the control electrode, as a result of which the device can be operated at small currents through the semiconductor layer which means a small heat dissipation.

In addition, at a constant field strength, locally occurring high field strengths and consequently occurring heat dissipating phenomena and danger of breakdown through an insulating layer or along the surface of the semiconductor layer are avoided.

The said advantages can be achieved by simple structural measures and an important preferred embodiment of a device according to the invention is characterized in that with the means for setting up a bias voltage at the control electrode, a bias voltage can be set up at the control electrode causing the concentration of charge carriers in a surface layer of the semiconductor layer adjoining the insulating layer to decrease and the resistance of the strip-shaped part located between the source and drain electrode to increase, the strip-shaped part of the semiconductor layer comprising notches from the source electrode in the direction of the drain electrode which narrow in the said direction.

A further important preferred embodiment of a device according to the invention is characterized in that with the means for setting up a bias voltage at the control electrode a bias voltage can be set up at the control electrode causing the concentration of charge carriers in a surface layer of the semiconductor layer adjoining the insulating layer to increase, the current between the source and drain electrode flowing for the greater part through the said surface layer, the strip-shaped control electrode comprising notches from the source electrode in the direction of the drain electrode which narrow in the said direction.

As a result of the narrowing notches in the two latter preferred embodiments a current path can occur only between the source and drain electrode with varying width.

Both the strip-shaped part of the semiconductor layer and the control electrode may advantageously comprise notches which, in a direction substantially at right angles to the semiconductor layer, are located over one another.

It is noted that the notches may wholly traverse the strip-shaped part of the semiconductor layer and/or the strip-shaped control electrode in the transverse direction. Preferably, however, in the case of the control electrode a narrow connection is maintained between two parts of the control electrode each located on one side of one notch as a result of which only one electric connection need be made with the control electrode.

Narrowing notches which, viewed in a direction substantially at right angles to the semiconductor layer, comprise two oppositely located convex substantially hyperbolic edges have been found to give particularly satisfactory results.

The invention further relates to semiconductor circuit elements comprising a semiconductor layer arranged on an electrically insulating support and provided with two connection electrodes, a strip-shaped part of the semiconductor layer being located between the two connection electrodes, an insulating layer supporting a strip-shaped control electrode being arranged on the said strip-shaped part, suitable for use in a semiconductor device according to the invention, a first preferred embodiment of which is characterized in that the strip-shaped part of the semiconductor layer comprises notches at right angles to its longitudinal direction from one of the connection electrodes in the direction of the other connection electrode which notches narrow in the said direction.

A second preferred embodiment of such a circuit element according to the invention is characterized in that the strip-shaped control electrode comprise notches at right angles to its longitudinal direction from one of the connection electrodes in the direction of the other connection electrode which narrow in the said direction. The characteristic feature according to the invention of the second embodiment may also be applied to the first embodiment.

Figure 2:
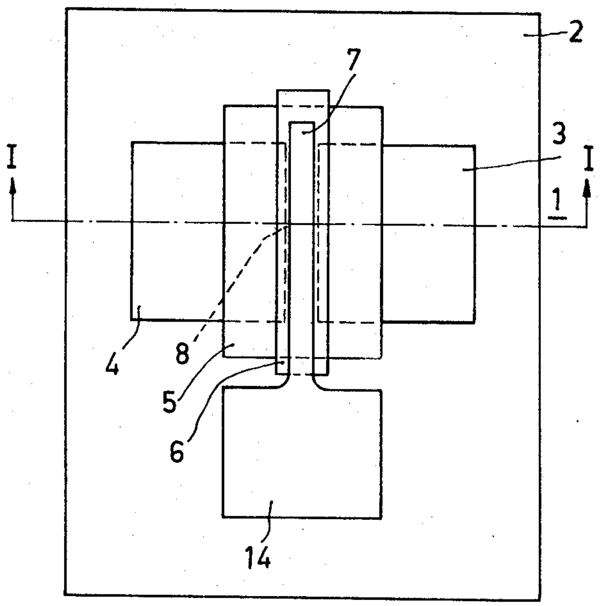
Figure 3:
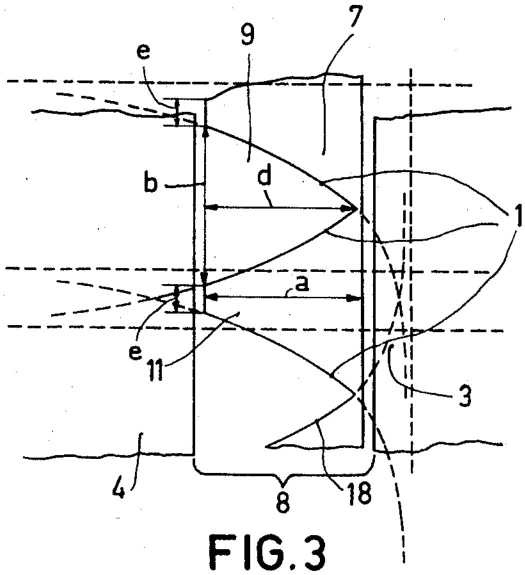

In order that the invention may readily be carried into effect, a few embodiments thereof will now be described in greater detail, by way of example, with reference to the accompanying drawing, in which FIG. 1 is a diagrammatic and partly a cross sectional view taken on the line I—I of FIG. 2 of an embodiment of a semiconductor device according to the invention, of which FIG. 2 is a plan view FIG. 3 shows on a larger scale a part of the plan view shown in FIG. 2

Figure 4:
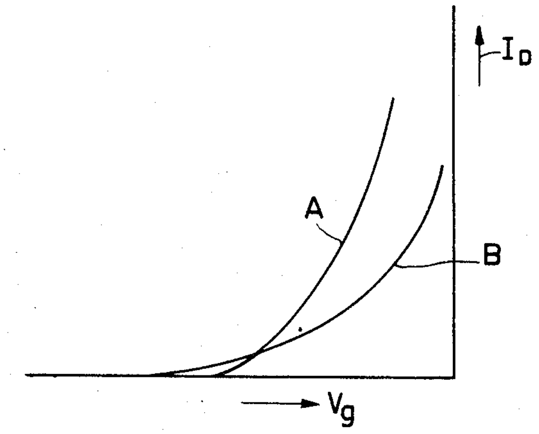

FIG. 4 shows two current-voltage characteristics of semiconductor devices to which the invention relates.

FIGS. 1 and 2 show an embodiment of a semiconductor device comprising a semiconductor layer 5 arranged on an electrically insulating support 2 and provided with a source electrode 4 and a drain electrode 3 shown with parallel facing edges, a strip-shaped part 8 of the semiconductor layer 5 being provided between the said electrodes 3 and 4, an insulating layer 6 being provided on the said strip-shaped part 8 and supporting a control electrode 7, means, the battery 12, being provided to set up a bias voltage at the drain electrode 3 with respect to the source electrode 4, a current flowing substantially transversely through the strip-shaped part 8 between the source and drain electrodes 4 and 3, substantially because charge carriers move in directions from the source electrode 4 to the drain electrode 3, further means, the battery 13, being provided for setting up a bias voltage at the control electrode 7 with respect to the source electrode 4 to influence the said current.

According to the invention the semiconductor device is characterized in that the path which the current can follow substantially transversely through the strip-shaped part 8 of the semiconductor layer 5 shows a width which increases in the direction from the source electrode 4 to the drain electrode 3, the said width being measured in the longitudinal direction of the strip-shaped part 8.

In the embodiment shown in FIGS. 1 and 2, in which by means of the battery 13 a bias voltage can be set up at the control electrode 7, in which the concentration of charge carriers in a surface layer of the semiconductor layer 5 adjoining the insulating layer 6 is increased and in which the current between the source and drain electrodes 4 and 3 for the greater part flows through the surface layer, the said widening of the current path is obtained in that according to the invention the control electrode 7 comprises notches 9, see FIG. 3, from the source electrode 4 in the direction of the drain electrode 3 which notches narrow in the said direction.

For clearness' sake the notches 9 are not shown in FIGS. 1 and 2 but in FIG. 3 which diagrammatically and on an enlarged scale shows a plan view of part of the strip-shaped control electrode with adjacent parts of the source electrode 4 and the drain electrode 3.

Since the surface layer with increased concentration of charge carriers in the semiconductor layer 5 occurs substantially only below the control electrode 7 and not below the notches 9, the said surface layer and consequently the current path between the source electrode 4 and the drain electrode 3 shows a widening in the direction of the source electrode 4 towards the drain electrode 3. The width of the current path preferably increases by at least a factor 2, while very favourable results are obtained when the said width increases by a factor at least equal to 5 and at most equal to 20.

The semiconductor circuit element 1 shown in FIGS. 1 and 2 which constitutes a TFT-transistor can be manufactured, the control electrode 7 expected, in a manner which is normal for TFT-transistors and comprises a configuration which is normal for the said transistors (the control electrode 7 excepted).

The semiconductor layer 5, for example, of weak n-type cadmium sulphide, and the electrodes 3 and 4, for example, of gold, are provided on the insulating support 2 of, for example, glass with dimensions of approximately 1 cm. x 1 cm. x ½ mm. First the electrodes 3 and 4 can be provided in a convential manner by vapour deposition through a mask. These electrodes 3 and 4 have dimensions, for example, of approximately 1 mm. x 1 mm. x 1,000 A. and are spaced apart 20$\mu$. The cadmium sulphide layer 5 may then be provided, also by vapour deposition through a mask, the layer 5 having dimensions of, for example, 1 mm. x 1.5 mm. x 2,000 A. The strip-shaped part 8 of the cadmium sulphide layer located between the electrodes 3 and 4 consequently has a trasverse dimension of approximately 20$\mu$, a length of approximately 1 mm. and a thickness of approximately 2,000 A. The layer resistance of the cadmium sulphide layer 5 is approximately $10^8$ ohm per square.

The insulating layer 6 having dimensions of approximately 1.7 mm. x 28$\mu$ x 1$\mu$ and consisting of silicon oxide is then provided by vapour deposition through a mask.

The strip-shaped control electrode 7 having a transverse dimension *a* (see FIG. 3) of approximately 19$\mu$ and a length exceeding that of the strip-shaped part 8 of the semiconductor layer 5 and provided with notches 9 and a widened end 14 (FIG. 2) for contact purposes which is located on the support 2 is provided on the insulating layer 6 by vapour deposition of gold through a mask. The thickness of the deposited gold layer is approximately 1,000 A.

The dimensions $b$ and $d$ of the notches 9 are approximately $10\mu$ and $18.5\mu$ respectively. The dimensions $e$ of the control electrode 7 are approximately $2\mu$.

So the width of the current path increases in the direction from the source electrode 4 to the drain electrode 3 by approximately a factor 6 since the width of a part 11 of the control electrode 7 located between two notches 9 increases from approximately $2\mu$ to approximataly $12\mu$.

Viewed in a direction substantially at right angles to the semiconductor layer 5, so in the plane of the drawing of FIG. 3, the narrowing notches comprise two oppositely located convex substantially hyperbolical edge 18. The resulting shape of the control electrode 7 has been found to give particularly good results. The asymptotes—the directions of which substantially coincide with the longitudinal and lateral directions of the strip-shaped part 8—of the hyperbolae of which the edges 18 form part are shown in broken lines in FIG. 3.

When the source electrode 4 is connected to earth and a bias voltage $V_D$ of 10 v. is set up at the drain electrode 3 by means of the battery 12 and a bias voltage $V_g$ of 15 v. is set up at the control electrode 7 by means of the battery 13, a current $I_D$ of approximately 50 ma. flows through the semiconductor layer 5 between the electrodes 3 and 4. The transconductance $g_m$ (the ratio between a variation in $I_D$ caused by a variation in $V_g$) in this case is $100\mu$ a./v. In a corresponding device employing a control electrode without the notches according to the invention, $g_m$ would be approximately $50\mu$ a./v. at the same $I_D$ so that in this case the invention provides an improvement by a factor 2 in $g_m$.

In FIG. 4 the curve A shows the dependence of $I_D$ on $V_g$ at constant $V_D$ in the device according to the invention described and the curve B shows the same dependence in a corresponding device employing a control electrode without notches. $V_g$ and $I_D$ are plotted in arbitary units. It clearly appears from these curves A and B that in the case of small $I_D$ a variation in $V_g$ in a device according to the invention causes a greater variation in $I_D$ than in the corresponding device, as a result of which the device according to the invention can be operated at smaller $I_D$ which means a lower heat dissipation.

The improvement described occurs because the field strength in the current path between the source and drain electrode in a device according to the invention is substantially constant from the source electrode 4 to the drain electrode 3, while in known devices the said field strength shows a great increase in the direction from the source electrode to the drain electrode in particular in the proximity of the drain electrode.

In addition to the control electrode 7 the strip-shaped part 8 also of the semiconductor layer 5 and, if required, the insulating layer 6 may also comprise notches, the notches of the semiconductor layer 5 and/or those of the insulating layer 6 and those of the control electrode 7, viewed in a direction substantially at right angles to the semiconductor layer 5, being located over one another. In other words, the notches in the various layers substantially coincide in the plan view shown in FIG. 3.

In a further important embodiment of a semiconductor device according to the invention the strip-shaped part 8 of the semiconductor layer 5 comprises notches of the shape as those of the notches 9 in FIG. 3 which narrow in the direction from the source electrode 4 to the drain electrode 3 and in which the control electrode need not comprise notches, while a bias voltage is set up at the control electrode 7 by means of the battery 13 at which voltage the concentration of charge carriers in a surface layer of the semiconductor layer 5 adjoining the insulating layer 6 is decreased and the resistance of the strip-shaped part located between the source and drain electrodes 4 and 3 is increased. In this case the bias voltage of the control electrode 7 must be smaller than that of the drain electrode 3, in which the control electrode 7 may also be biased negatively with respect to the source electrode 4.

In this case the said semiconductor element 1 may further have the same dimensions and consist of the same materials as the circuit element described in the preceding embodiment and it may be manufactured with similar methods as those which are discussed in the preceding example. The n-type cadmium sulphide layer may advantageously be somewhat more low-ohmic and, for example, have a layer resistance of $10^6$ ohm per square.

Since in this case a surface layer is formed adjoining the insulating layer 6 with decreased concentration of charge carriers, the current must search its way through the rest of the strip-shaped part 8 of the semiconductor layer 5, as a result of which, to obtain an increasing width of the current path, in this case the strip-shaped part 8 itself must be provided with narrowing notches. In this case the insulating layer 6 and/or the strip-shaped control electrode 7 also may be provided with notches which, in the plan view shown in FIG. 3, coincide with those of the strip-shaped part 8. In this embodiment similar advantages are obtained as those which are mentioned in the preceding embodiment.

In the embodiments described input signals can be applied to the device by means of a signal source 21 (FIG. 1) and output signals can be derived at the terminals 15 through the load 16.

It is noted that, besides by direct vapour deposition through a mask provided with a suitably shaped aperture during the provision of the layer or layers concerned, the notches can be obtained also after the provision of the layer or layers concerned by etching in a manner which is normal in semiconductor technology by means of a photohardening lacquer (photoresist) and an etching agent.

It will be clear that the invention is not restricted to the embodiments described and that many variations are possible for the expert without leaving the scope of this invention. Although the notches 9 in the control electrode 7 preferably do not extend wholly from the source electrode 4 to the drain electrode 3, this is well possible in which the parts of the electrode 7 separated by the notches 9 can be interconnected by separate contact wires. When the strip-shaped part 8 of the semiconductor layer 5 comprises notches, said notches may extend wholly from the source electrode 4 to the drain electrode 3. It is noted that the control electrode 7 may consist alternatively of a single part 11 bounded by two edges 18 (see FIG. 3) or of only half of such a part 11 (this part bounded by an edge 18 and by a straight line transversely across the strip-shaped part 8). The strip-shaped part 8 also may have such a shape. In this case the said advantages of a semiconductor device according to the invention are maintained. Instead of electron conductivity (n-type semiconductor material for the semiconductor layer 5) hole conductivity may be used in the embodiments described by using n-type semiconductor material in which the bias voltage at the electrodes have to be adapted in normal manner. Instead of cadmium sulphide other semiconductor materials, for example, cadmium selenide, tellurium, zinc telluride, tin oxide, indium oxide or gallium arsenide may be used. The insulating layer may consist, for example, of magnesium fluoride instead of silicon oxide. A semiconductor circuit element according to the invention may be assembled with other circuit elements, for example, further TFT-transistors, in a semiconductor layer to form a composite semiconductor circuit element.

What is claimed is:

1. A semiconductor device comprising an electrically-insulating support and on the support a layer of semiconductive material, source and drain spaced electrode connections to said semiconductive layer whereby when a voltage is applied therebetween a current passes substantially transversely through a strip-shaped portion of said semiconductive layer between said electrodes, said source and drain electrodes having facing edges that are parallel to one another, an electrically-insulating layer on said semiconductive layer and overlying said strip-like current-carrying portion, a generally strip-shaped control electrode on said electrically-insulating layer and overlying said current-carrying portion, and means for causing the said current-carrying portion, measured in the longitudinal direction of the strip-shaped portion, to widen in a direction from the source electrode to the drain electrode.

2. A device as set forth in claim 1 wherein a voltage is applied to the control electrode causing the device to operate in the depletion mode, and the strip-shaped portion of the semiconductive layer comprises at least one notch extending from the source electrode to the drain electrode and which narrows in the direction of the source to the drain.

3. A device as set forth in claim 2 wherein the notch edges form oppositely-disposed, convex, substantially hyperbolic curves.

4. A device as set forth in claim 1 wherein a voltage is applied to the control electrode causing the device to operate in the enhancement mode, and the strip-shaped control electrode comprises at least one notch extending from the source electrode to the drain electrode and which narrows in the direction of the source to the drain.

5. A device as set forth in claim 4 wherein the notch edges form oppositely-disposed, convex, substantially hyperbolic curves.

6. A semiconductor device comprising an electrically-insulating support and on the support a layer of semiconductive material, source and drain spaced electrode connections to said semiconductive layer whereby when a voltage is applied therebetween a current passes substantially transversely through a strip-shaped portion of said semiconductive layer between said electrodes, an electrically-insulating layer on said semiconductive layer and overlying said strip-like current-carrying portion, a generally strip-shaped control electrode on said electrically-insulating layer and overlying said current-carrying portion, and means for causing the said current-carrying portion, measured in the longitudinal direction of the strip-shaped portion, to widen in a direction from the source electrode to the drain electrode, the difference of the width of the said current-carrying portion from one electrode to the other varying by at least a factor of 5 and at most a factor of 20.

7. A device as set forth in claim 6 wherein both the strip-shaped portion of the semiconductive layer and the control electrode comprise notches which substantially overlap one another and which narrow in the direction of the source to the drain.

References Cited

UNITED STATES PATENTS

| | | | |
|---|---|---|---|
| 3,258,663 | 6/1966 | Weimer | 317—235 |
| 3,275,908 | 9/1966 | Grosvalet | 317—235 |
| 3,302,078 | 1/1967 | Skellett | 317—235 |
| 3,321,680 | 5/1967 | Arndt et al. | 317—235 |

JOHN W. HUCKERT, *Primary Examiner.*

JERRY D. CRAIG, *Assistant Examiner.*